(12) United States Patent
Secareanu et al.

(10) Patent No.: US 7,683,483 B2
(45) Date of Patent: Mar. 23, 2010

(54) ELECTRONIC DEVICE WITH CONNECTION BUMPS

(75) Inventors: Radu M. Secareanu, Phoenix, AZ (US);
Suman K. Banerjee, Tucson, AZ (US);
Olin L. Hartin, Phoenix, AZ (US);
Sandra J. Wipf, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 215 days.

(21) Appl. No.: 11/671,048

(22) Filed: Feb. 5, 2007

(65) Prior Publication Data
US 2008/0185686 A1 Aug. 7, 2008

(51) Int. Cl.
*H01L 23/48* (2006.01)
*H01L 29/00* (2006.01)

(52) U.S. Cl. .................. 257/737; 257/536; 257/778; 257/738; 257/787; 257/E23.01; 257/E29.001

(58) Field of Classification Search .............. 438/122; 257/536, 778, 737, 738, 787, E23.01, E29.001
See application file for complete search history.

(56) References Cited

U.S. PATENT DOCUMENTS

| | | | |
|---|---|---|---|
| 5,767,570 A | | 6/1998 | Rostoker |
| 5,877,560 A | * | 3/1999 | Wen et al. ............ 257/778 |
| 5,939,739 A | * | 8/1999 | O'Keefe ............... 257/197 |
| 6,022,792 A | | 2/2000 | Ishii et al. |
| 6,591,410 B1 | * | 7/2003 | Ali et al. .............. 716/12 |
| 6,681,982 B2 | * | 1/2004 | Tung ..................... 228/197 |
| 6,838,941 B2 | | 1/2005 | Yamamoto et al. |
| 7,034,391 B2 | | 4/2006 | Pendse |

(Continued)

OTHER PUBLICATIONS

Jo Das, Herman Oprins, Hangfeng Ji, Andrei Sarua, Wouter Ruythooren, Joff Derluyn, Martin Kuball, Marianne Germain, and Gustaaf Borghs; Improved Thermal Performance of AlGaN/GaN HEMTs by Optimized Flip Chip Design; IEEE Transactions on Electron Devices, vol. 53, No. 11, Nov. 2006. p. 2696-2702.*

(Continued)

*Primary Examiner*—Fernando L Toledo
*Assistant Examiner*—John P Dulka
(74) *Attorney, Agent, or Firm*—Ingrassia, Fisher & Lorenz, P.C.

(57) ABSTRACT

Flip-chip electronic devices (40, 70, 80, 90) employ bumps (42, 72, 82) for coupling to an external substrate. Device cells (43, 73, 83, 93) and bumps (42, 72, 82) are preferably arranged in clusters (46) where four bumps (42, 72, 82) substantially surround each device cell (43, 73, 83, 93) or form a cross with the device cell (43, 73, 83, 93) at the intersection of the cross. The bumps (42, 72, 82) are desirably spaced apart by the minimum allowable bump (42, 72, 82) pitch ($L_m$). Typically, each device cell (43, 73, 83, 93) contains one or more active device regions (44, 74, 86, 96) depending on the overall function. Complex devices (40, 70) are formed by an X-Y array of the clusters (46), where adjacent clusters (46) may share bumps (43, 73, 83, 93) and/or device cells (43, 73, 83, 93). In a preferred embodiment, the bumps (42, 82) form the outer perimeter (48) of the device (40, 80, 90). The maximum device temperature and overall noise is reduced.

25 Claims, 7 Drawing Sheets

U.S. PATENT DOCUMENTS

| | | | |
|---|---|---|---|
| 7,314,791 B2* | 1/2008 | Beasom | 438/205 |
| 2004/0159939 A1* | 8/2004 | Joshi | 257/723 |
| 2005/0017336 A1* | 1/2005 | Kung et al. | 257/685 |
| 2005/0140436 A1 | 6/2005 | Ichitsubo et al. | |
| 2005/0176380 A1 | 8/2005 | Okabe et al. | |

OTHER PUBLICATIONS

H. Sato, M. Miyauchi, K. Sakuno, M.Akagi, M.Hasegawa, J.K. Twynam, K. Yamamura, and T. Tomita; Bump Heat Sink Technology; Gallium Arsenide Integrated Circuit (GaAs IC) Symposium, 1993. Technical Digest 1993., 15th Annual. Publication Date: Oct. 10-13, 1993. p. 337-340.*

Debabrata Gupta, A novel active area bumped flip-chip technology for convergent heat transfer from gallium arsenide power devices; IEEE Transactions on Components, Packaging, and Manufacturing Technology—Part A, vol. 18, No. 1 Mar. 1995; p. 82-86.*

PCT/US2008/051783 International Search Report and Written Opinion.

* cited by examiner

—RELATED ART—

US 7,683,483 B2

ELECTRONIC DEVICE WITH CONNECTION BUMPS

TECHNICAL FIELD

The present invention generally relates to electronic structures, and more particularly relates to electronic structures and devices employing connection bumps.

BACKGROUND

Many electronic devices utilize solder bumps or the like for attachment and interconnection to a circuit board or other mounting structure. Flip-chip semiconductor devices are a common example. Such devices may comprise a single element or a small number of elements, or a complex arrangement of elements in an integrated circuit or in circuits of intermediate complexity. Such flip-chip devices usually are provided with solder bumps or equivalent during wafer processing. As used herein, the words "bumps" and "solder bumps" are intended to include bumps formed using any type of conductor with or without solder. Such bumps protrude from the surface of the semiconductor or other die. When the semiconductor or other die is to be coupled to its supporting substrate it is flipped over so that the bumps face toward the substrate and line up with mating attachment pads to which they are attached, e.g., by soldering. This is well known in the art. The composition and method of formation of the bumps themselves is outside the scope of the present embodiments.

The performance of such flip-chip devices, whether of semiconductor or other types of elements, depends critically on the placement of the bumps relative to the active regions and other elements on the die. In many prior art flip-chip devices, the placement of the bumps has focused more on their use for electrical coupling and less on their potential use for thermal coupling, that is, for removing heat from the chip. As a consequence, the electrical and thermal performance of such bumped devices is often less than desired. Accordingly, there is a need for improved device structures employing bumps that can provide improved performance, especially thermal performance. It is desirable to provide devices employing attachment/connection bumps that offer, for example, reduced operating temperatures without a significant increase in the total occupied area. Further, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
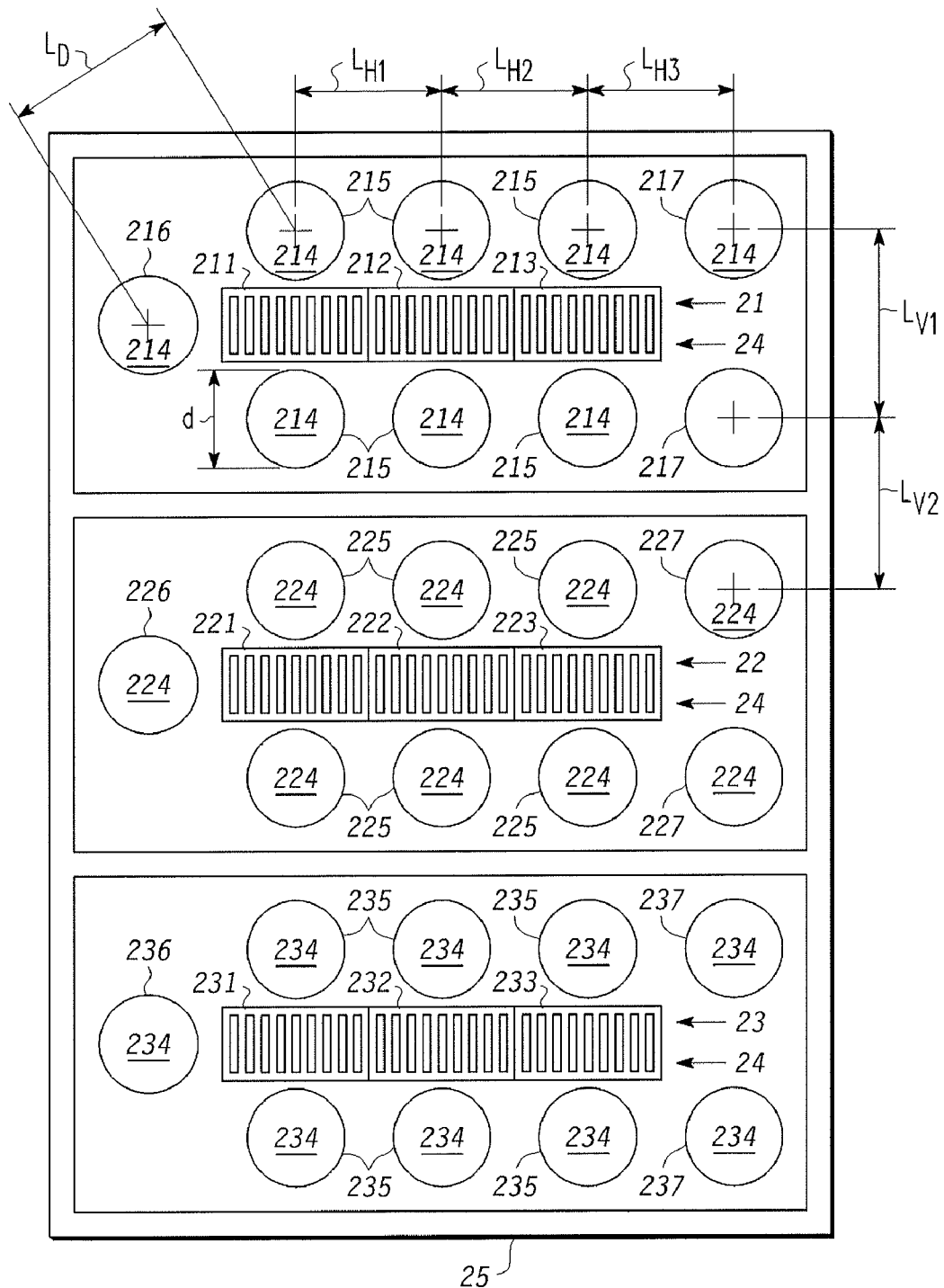
FIG. 1 is a simplified plan view of a high frequency semiconductor power amplifier having bumps for attachment and mounting.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in, out," "front," "back," "up," "down, "top," "bottom," "over," "under," "above," "below," "" "horizontal," "vertical," "diagonal," and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner. The present invention does not depend upon the type of semiconductor material used for creating the various elements making up the electronic devices described herein, nor is it essential that the structures or devices described herein include semiconductor materials.

FIG. 1 is a plan view of high frequency semiconductor power amplifier 20 comprising three rows 21, 22, 23 of semiconductor amplifying elements 24 formed in substrate 25, each row having three cells 211-213, 221-223, 231-233 of eight devices per cell, forty micrometer finger length per device, each device having two (e.g., emitter) fingers. For simplicity, the interconnections that couple the various amplifying elements to various connection bumps 214, 224, 234 are omitted. Each row 21, 22, 23 of amplifying elements 24 is surrounded by a group of nine bumps 214, 224, 234, which are coupled to the various devices in each row. These bumps permit device 20 to be connected to an external circuit board (not shown) electrically and/or thermally. Some bumps primarily provide electrical connections and some primarily provide thermal connection. Such thermal bumps provide heat extraction paths from the die to the supporting substrate to facilitate heat removal and may or may not connect to particular device terminals. Accordingly, the number of bumps used often exceeds the number of connections that are needed merely for electrical operation of the device.

In this example, the bumps have the same diameter and are separated by horizontal spacings $L_{H1}$, $L_{H2}$, $L_{H3}$, vertical spacings $L_{V1}$, $L_{V2}$, and diagonal spacings $L_D$, etc., collectively spacings L. It is common to require that L not be smaller than a predetermined minimum value $L_m$, referred to as the minimum bump pitch. This is to insure that when device 20 is inverted, mounted on its mating circuit board and attached, e.g., by soldering the bumps to their mating pads, that shorts do not develop between the pads, for example by solder bridging. The minimum bump pitch $L_m$ (i.e., the minimum center-to-center spacing) will depend on the bump diameter d (or equivalent lateral dimension for non-circular bumps). Currently, $L_m$ is about 200 micrometers for bumps of about d=105 to 125 micrometers, preferably about 115 micrometers, but the particular values of $L_m$ and d are not critical to the present invention. Larger or smaller values could also be used, provided that solder bridging or the like is avoided. It will be understood that the bumps cannot be placed arbitrarily close together but must, for practical reasons have some minimum separation $L_m$–d. With d=115 micrometers and $L_m$=200 micrometer, device 20 has 27 bumps, 2×72 device fingers of about 5760 square micrometers emitter area and the overall device occupies about 1.1 sq mm.

Figure 2:
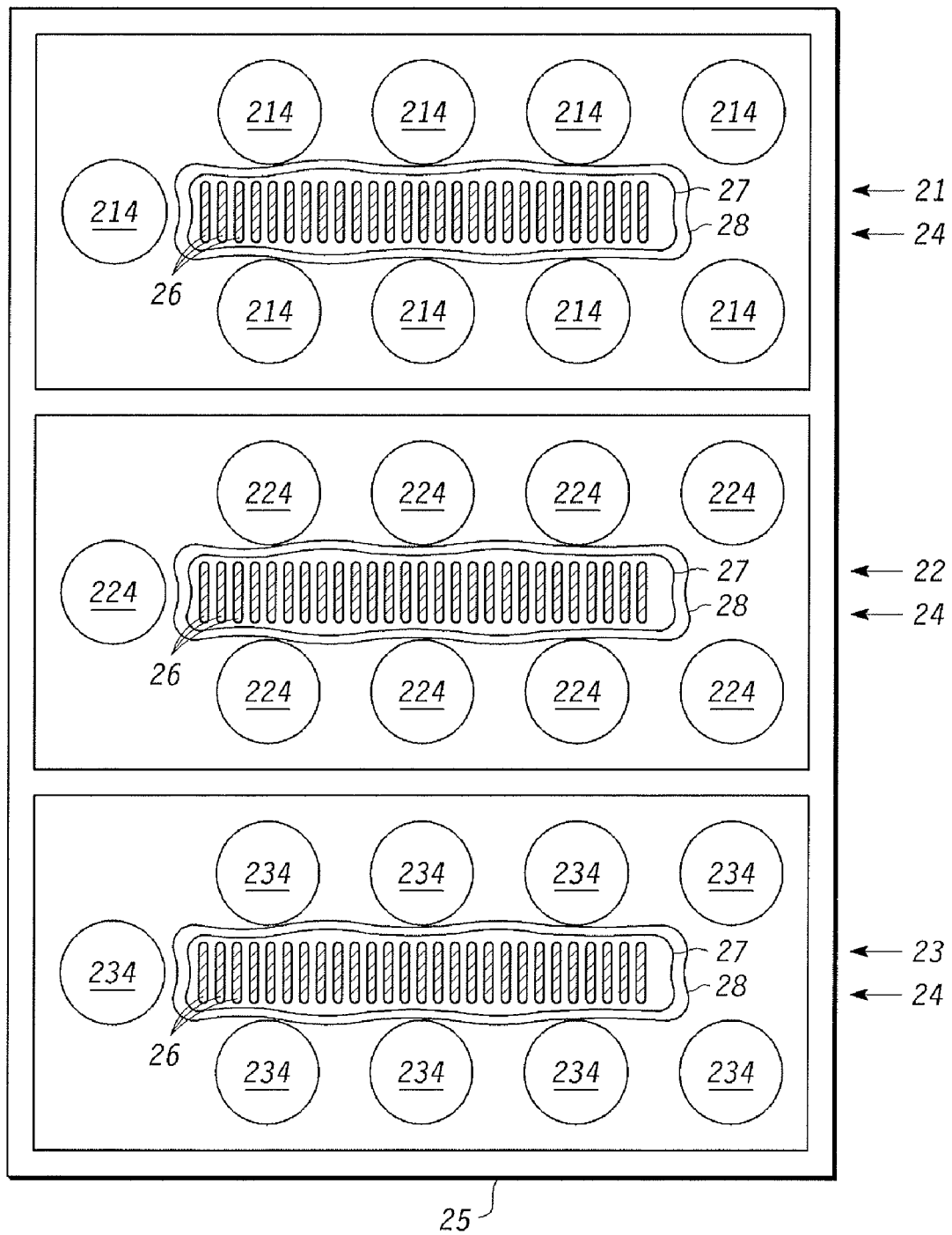
FIG. 2 is a simplified thermal image of the device of FIG. 1 during operation showing regions of different temperature.

One of the difficulties associated with such bump-device layouts is that the operating temperature distribution within device 20 can be highly non-uniform. FIG. 2 shows thermal image 30 of device 20 during operation, from which the operating temperatures of the various elements in device 20 may be deduced. It is found that with the layout shown in FIG. 1 that device elements 24 associated with each finger 21, 22, 23 reach an operating temperature of about 133 degrees Celsius, almost constant across all of the device elements as shown by hatched regions 26 in thermal image 30. Contours 27, 28 indicate intermediate temperature regions. While this maximum temperature is tolerable, and device 20 provides useful properties it is desirable to reduce the device operating temperature and, if possible, further improve its properties.

Figure 3:
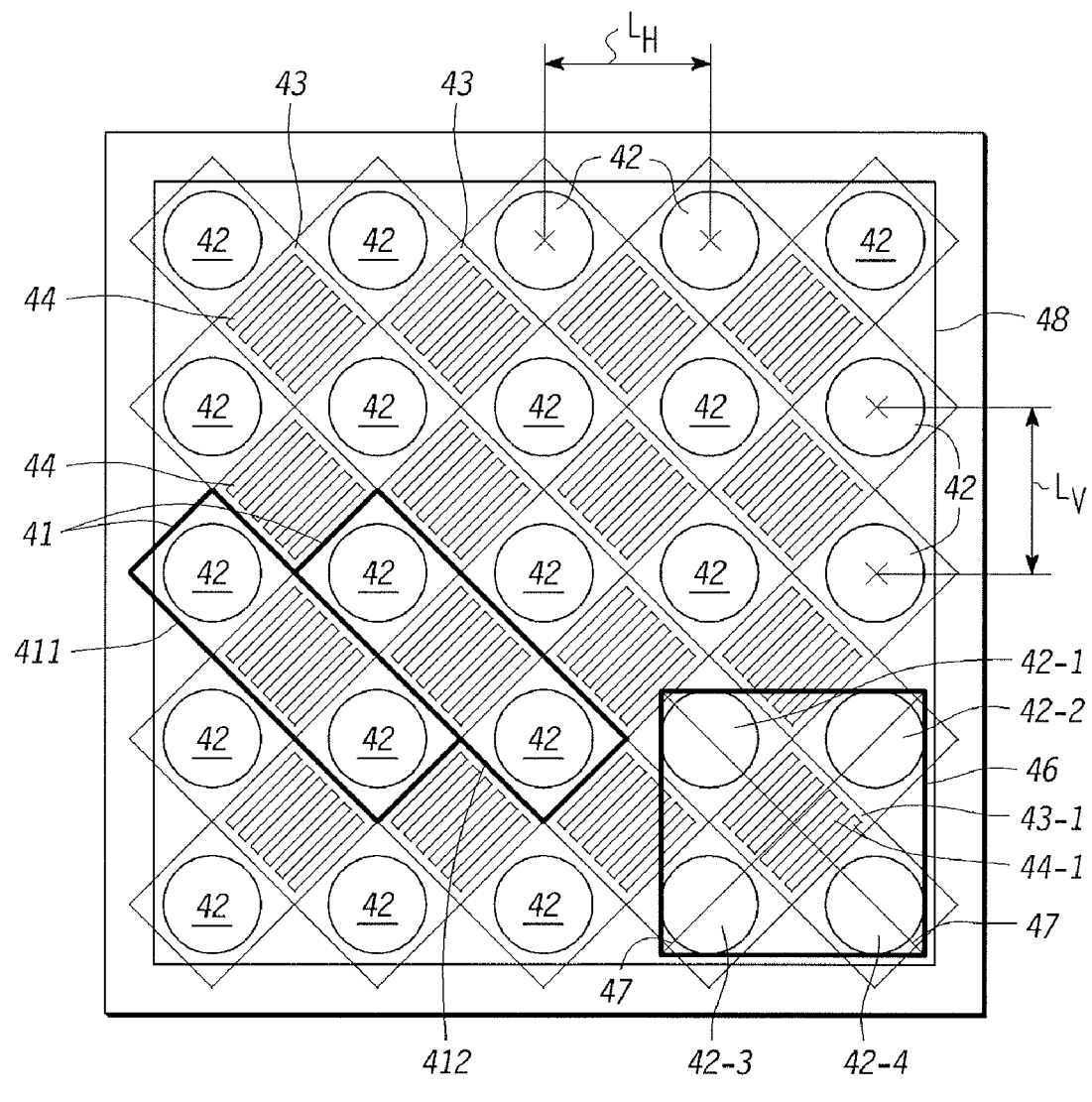
FIG. 3 is a simplified plan view of a high frequency semiconductor power amplifier operationally equivalent to that of FIG. 1, having bumps for attachment and mounting, according to an embodiment of the present invention.

It has been observed that only bumps 215, 225, 235 are in close enough proximity to device cells 211-213, 221-223, 231-233 to provide efficient heat exaction from the active regions of the device cells. For convenience, these eighteen bumps 215, 225, 235 are referred to as "thermal" bumps even though they may also have electrical functions. Bumps 216-217, 226-227, 236-237 are further away from device cells 211-213, 221-223, 231-233 and while they may be useful for electrical connections, they are not optimally disposed for efficient heat extraction. Thermal bumps typically connect from the device ground metal to the chip or die substrate. FIG. 3 is a simplified plan view of high frequency semiconductor power amplifier 40 operationally equivalent to that of FIG. 1, having bumps 42 of diameter d, horizontal spacings $L_H$ and vertical spacings $L_V$, according to an embodiment of the present invention. $L_H$ and $L_V$ desirably equal $L_m$. The electrical and thermal performance of device 40 equals or exceeds that of device 20 of FIG. 1. In exemplary device 40 there are twenty-five bumps, sixteen device cells, four devices per cell, forty-five micron finger length per device for the active regions (e.g., emitters) and two fingers per device for a total 5760 square micrometers emitter area, the same as in device 20. Device 40 occupies 1.15 sq mm area, less than five percent larger than device 20. However, unlike device 20 of FIG. 1, all twenty-five bumps 42 of device 40 are in close thermal proximity to device cells 43 and therefore more effective in heat removal from device 40 than the eighteen "thermal" bumps of device 20. The active area is substantially the same as for device 20 and the power output and frequency response of device 40 are substantially equal or better than that of device 20. The active device regions providing the 5760 square micrometers emitter area have been rearranged relative to those of device 20 by subdividing them into sixteen device cells 43 so that each device cell can be centrally located between four minimum-spaced bumps 42 that preferentially form an equal-sided square or a cross shape whose size corresponds to minimum bump pitch $L_m$ for predetermined bump diameter d (e.g., about 115 micrometers). Stated another way, device cell 43 is surrounded by four bumps 42, desirably minimum spaced. These four bumps and included device cell are referred to as cluster 46. Cluster 46 comprises, for example, cell 43-1 of devices 44-1 centrally located within four bumps 42-1, 42-2, 42-3 and 42-4. Device 40 is formed by assembling multiple copies of cluster 46 until the desired total number of device fingers and/or the total desired active area are included. Cluster 46 may be viewed as a square with bumps (e.g., 42-1 through 42-4) at each corner and the device cell (e.g., cell 43-1) centrally located between the four surrounding bumps. Device cell 43-1 is preferably aligned along a diagonal axis (e.g., axis 47) of cluster 46. Stated another way, cluster 46 has the shape of a cross with axes or arms 47 and bumps 42-1, 42-2, 42-3, 42-4 located equally spaced on arms 47 of the cross with device cell 43-1 at the intersection of arms 47. For most efficient space utilization, it is desirable that a square array of clusters be formed, as for example is illustrated in FIG. 3, but this is not essential. It will also be noted that bumps and/or device cells may be shared between adjacent clusters and that, preferably but not essentially, exterior perimeter 48 of device 40 is entirely framed by bumps. Stated another way, device cells 43 lie within perimeter 48 drawn around the outer-most bumps, which desirably but not essentially, has a square shape. Such arrangements provide for close thermal coupling of device cells 43 to bumps 42. This is highly desirable.

Figure 4:
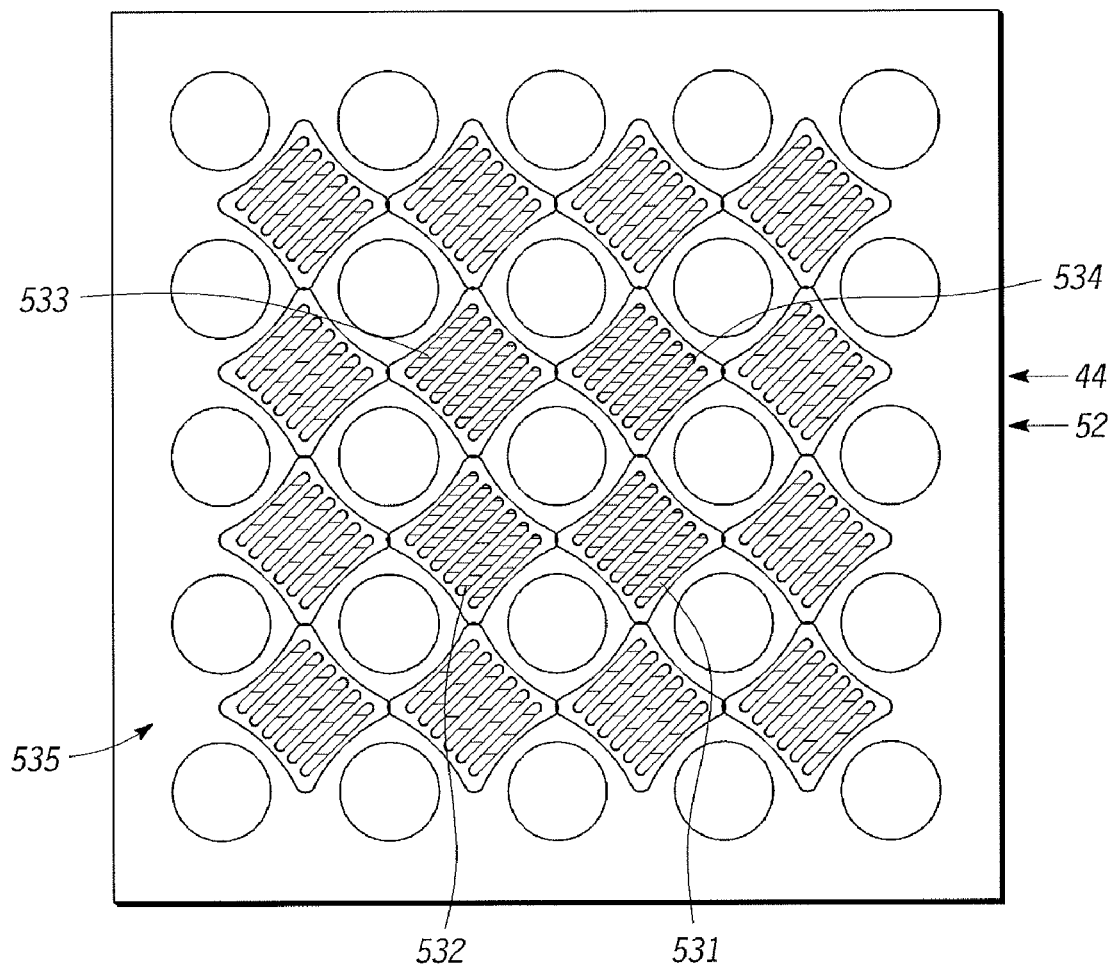
FIG. 4 is a simplified thermal image of the device of FIG. 3 during operation showing regions of different temperature.

The performance of device 40 is superior to that of device 20 in several respects. FIG. 4 shows simplified thermal image 50 of device 40 of FIG. 3 during operation allowing the interior temperature of device 40 to be measured. Thermal images 52 of device fingers 44 are hatched, the density of hatching indicating the relative temperature. For example, as indicated by their higher hatch density, four centrally located device cells 531, 532, 533, 534 show a maximum temperature of about 122 degrees Celsius and remaining device cells 535 show a temperature of about 116 degrees Celsius. These temperatures are significantly lower than the temperature of 133 degrees Celsius for device fingers 24 observed with device 20 of FIG. 1. This results from bringing active device cells 43 into closer and more uniform proximity to bumps 42, since bumps 42 can provide efficient local heat extraction. Thus, by allocating device fingers 44 to device cells 43 in such a way that device cells 43 can be centrally located and substantially surrounded by bumps, especially using minimum spacing bumps as is illustrated in cluster 46 of FIG. 3, heat transfer away from the active regions (e.g., device fingers 44) within device cell 43 is improved. Hence, the maximum device temperature as well as the average device temperature is reduced compared to the layout of FIG. 1. This temperature reduction is a significant improvement, since in general, long term reliability and overall device performance improve as device temperatures are lowered.

While clusters 46 are illustrated in FIGS. 3-4 as being geometrically square with device cell 43-1 at the center of four surrounding bumps 42-1 through 42-4, this is merely for convenience of illustration. While this is often the desired configuration what is preferred is that cluster 46 be "thermally square", that is, with bumps 42-1 through 42-4 disposed in substantially equal thermal proximity to those device elements within device cell 43-1 where heat is being generated during device operation. Thus, in selecting the number of active device elements (where most heat is generated) to include within device cell 43-1, consideration can be given to the size of active elements, their shape and distribution with cell 43-1. The objective is to place the heat sources in close proximity to the surrounding thermal bumps in a symmetrical way so that the thermal path lengths are minimized and equalized as far as possible. Stated another way, a thermally square cluster is one in which the center distances from any side of the device cell to its adjacent bump are equal with respect to the local thermal energy being dissipated in the device cell at that point. The desirable condition for a thermally square cluster is to have the bumps of the cluster substantially equally share the dissipation originating within the device cell and be as close as possible thereto to minimize and equalize the thermal impedance, while still satisfying the minimum spacing requirement. Thermal bumps 42-1 through 42-4 are preferably coupled to ground or substrate reference potential since this often also provides the lowest thermal impedance, but that is not essential.

Figure 5:
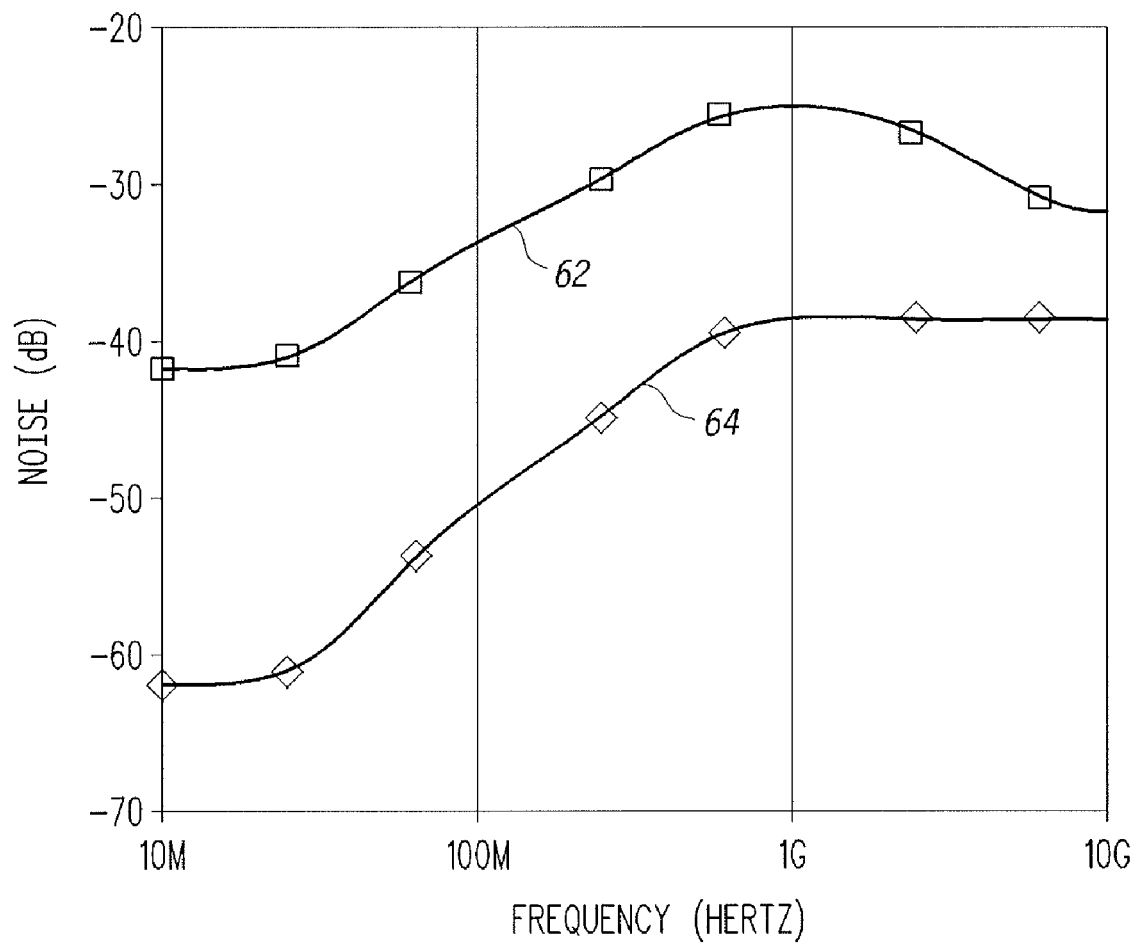
FIG. 5 is a plot of amplifier noise versus frequency comparing the devices of FIGS. 1 and 3.

It has been found that the arrangement illustrated in FIG. 3 has other advantages. FIG. 5 shows plot 60 of amplifier noise in decibels (DB) versus frequency in Hertz comparing the devices of FIGS. 1 and 3. Trace 62 shows the noise output versus frequency for device 20 of FIG. 1 and trace 64 shows the noise output versus frequency of device 40 of FIG. 3. It will be noted that the noise output from device 40 of FIG. 3 is substantially less than that from device 20 of FIG. 1. For example, at 1.5 Giga-Hertz operating frequency, device 40 has approximately 14 DB lower noise output than device 20. This is a significant improvement. The lower noise output is obtained because the denser arrangement of bumps provided in device 40 lowers the overall substrate impedance to ground or other common connection so that noise currents injected into the substrate during device operation are diverted to ground and are less likely to impact overall device operation or other circuitry that may be placed on the same die. This is a significant advantage.

Figure 6:
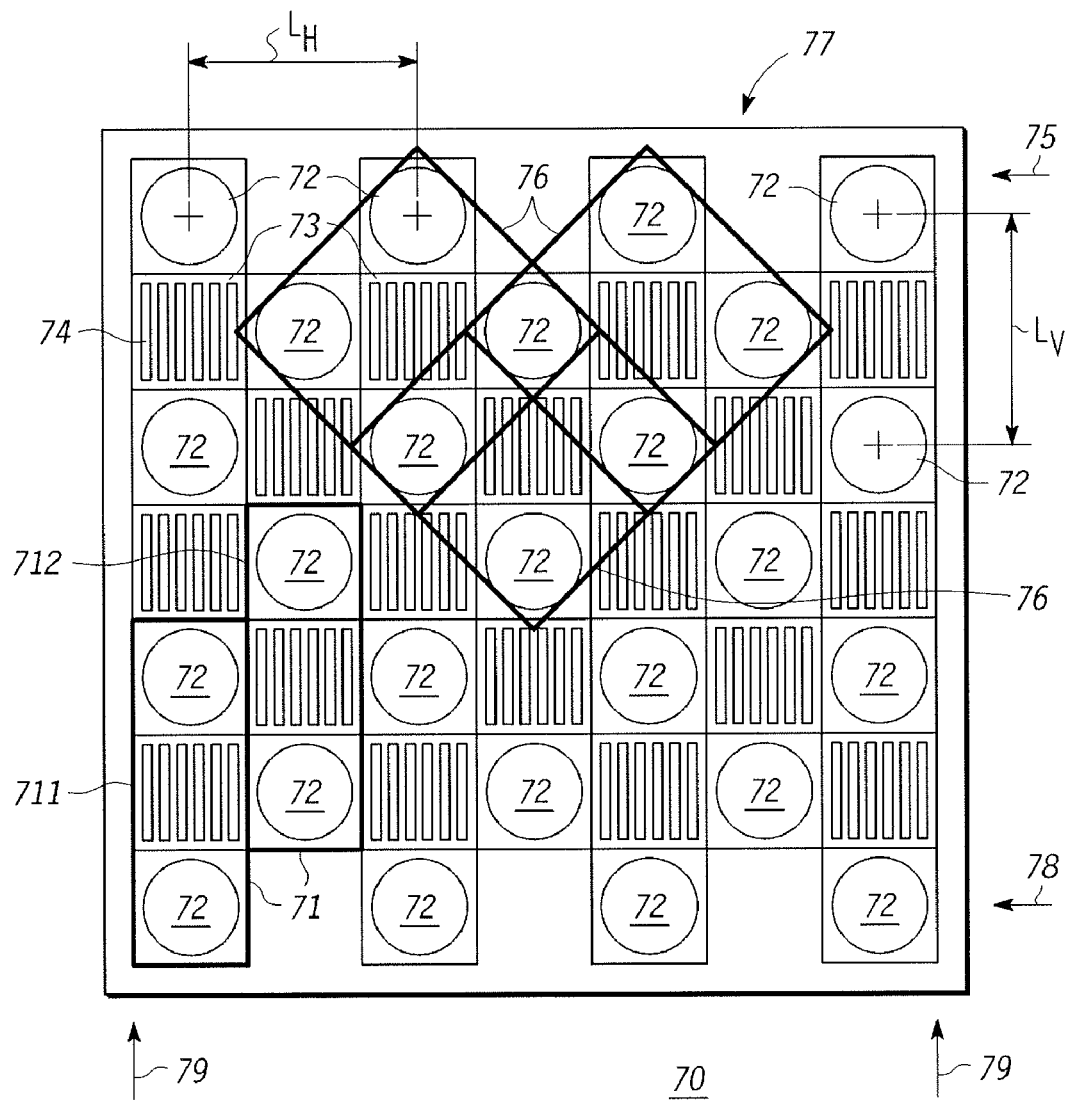
FIG. 6 is a simplified plan view of a high frequency semiconductor power amplifier analogous to that of FIG. 3 and having bumps for attachment and mounting, according to a further embodiment of the present invention.

FIG. 6 is a simplified plan view of high frequency semiconductor power amplifier device 70 analogous to that of FIG. 3 having bumps for attachment and mounting, but according to a further embodiment of the present invention. Device 70 has eighteen device cells 73 containing, for example, the same number of fingers or elements 74 as cells 43 of device 40 of FIG. 3, and twenty-five adjacent bumps 72 (the same number as for device 40) with horizontal spacing $L_H$ and vertical spacing $L_V$, both preferably equal to $2^{1/2}$ times the minimum pitch spacing $L_m$, or such other factor as will insure that no bumps have a pitch spacing smaller than $L_m$. Rows of bumps 75, 78 are provided at the top and bottom of array 77 of device cells 73 adjacent the outermost of device cells 73, but not also along vertical sides 79, since bumps in analogous positions along sides 79 would not be spaced at minimum distance $L_m$ from other bumps. Alternatively, bumps may be placed along the sides but not along the top and bottom with this layout. Most of device cells 73 of device 70 are surrounded by four bumps, thereby forming clusters 76 analogous to clusters 46 those of FIG. 3. As shown, clusters 76, like clusters 46, may overlap so that bumps and/or device cells are shared. However; those device cells along vertical sides 79, lack outboard bumps. Such clusters will have a less favorable thermal environment than those clusters along the top and bottom device cell rows. Nevertheless, this is tolerable since the outermost device cells are generally not the hottest cells, which are the centrally located device cells. Thus, even with this cell arrangement, the thermal performance is better than that of device 20 of FIG. 1, and further flexibility is obtained so that different ratios of device cells to bumps can be utilized, depending upon the needs of the device designer.

Figure 7:
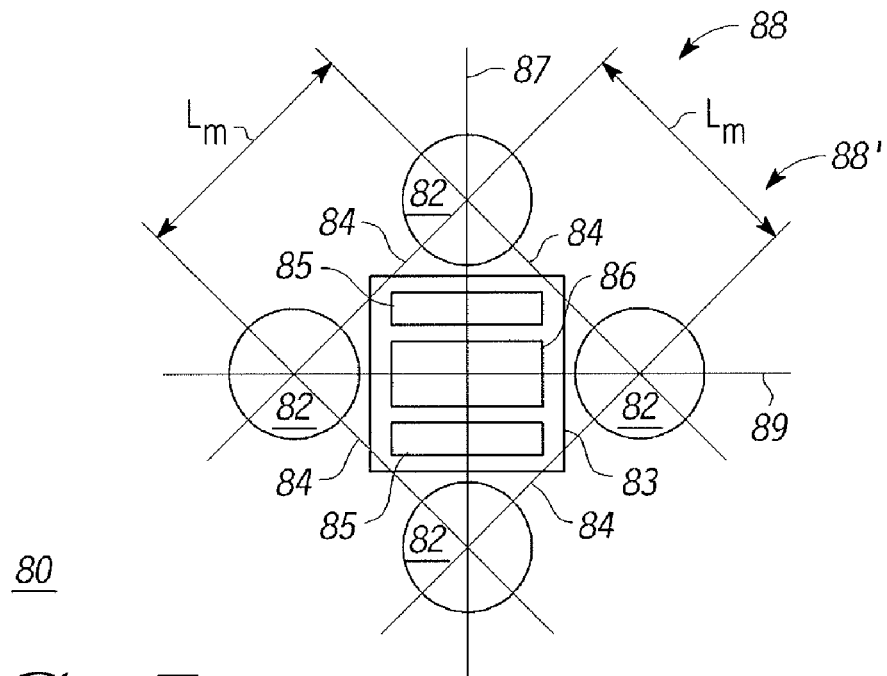
FIG. 7 is a simplified plan view of a single device cell with associated bumps according to another embodiment of the present invention.
Figure 8:
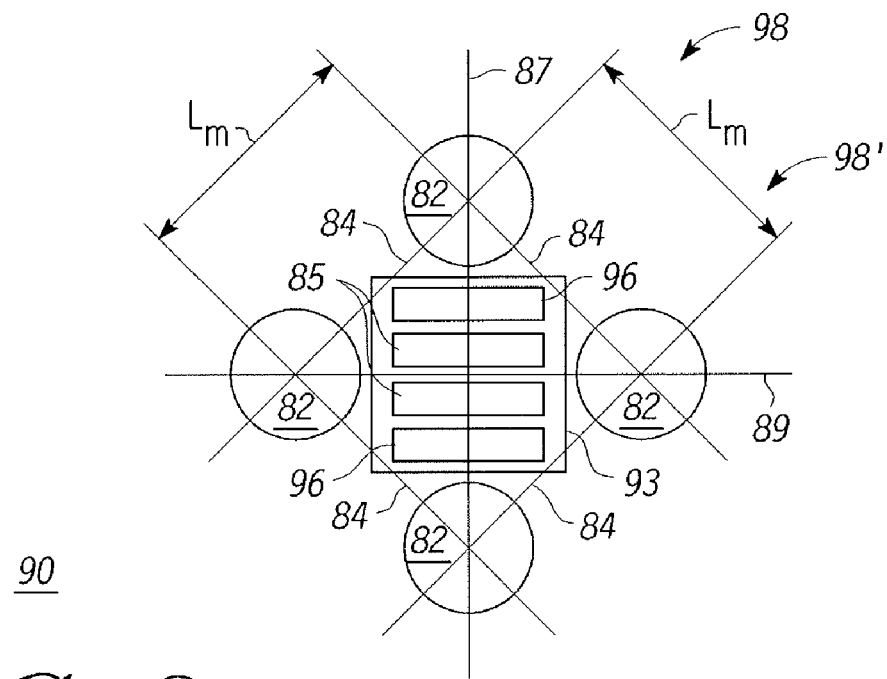
FIG. 8 is a simplified plan view of a single device cell with associated bumps analogous to that of FIG. 7 but according to yet another embodiment of the present invention.

FIGS. 7-8 are simplified plan views of single devices 80, 90 with associated bumps 82, according to further embodiments of the present invention. Four bumps 82 are arranged in a square-shaped cluster 88, 98 with sides 84 or in a cross-shaped arrangement 88', 98' with axes 87, 89, with device cell 83, 93 centrally located therebetween. In device 80 of FIG. 7, device cell 83 has ballast resistors 85 located proximate upper and lower bumps 82 and active device region 86 located centrally between ballast resistors 85. In device 90 of FIG. 8, active device region 86 is split into two portions 96 that are located proximate upper and lower bumps 82 and ballast resistors 85 are centrally located therebetween. Stated alternatively, bumps 82 are arranged to form cross 88', 98' having arms 87, 89 with bumps 82 lying on the arms of the cross and with device cells 83, 93 lying at the intersection of arms 87, 89. Active device regions 86, 96 and ballast resistors 85 have their long dimensions parallel to first arm 89 of the cross. In FIG. 7 ballast resistors 85 are closer to bumps 82 lying on second arm 87 of the cross with active device region 86 therebetween. In FIG. 8, the two split active device regions 96 are located closer to bumps 82 lying on second arm 87 of the cross, with ballast resistors 85 therebetween. The arrangement of FIG. 8 is preferred because it places the active device regions, e.g., device regions 96, where more heat is likely to be dissipated in closer proximity to bumps 82, which can therefore more efficiently extract heat from device 90 compared to device 80. This is a significant advantage.

Referring again to FIGS. 3 and 6, the topology of device cells 43, 73 and bumps 42, 72 can be described in other but equivalent ways. For example, clusters 41, 71 can be formed of two bumps 42, 72 placed on either side of a single device cell 43, 73. These clusters are then arranged in side-by-side adjacent parallel lines with the clusters of one line displaced or staggered in the direction of the line from clusters in the adjacent line so that bumps in the adjacent line, line up with the device cells of the first line. While elemental clusters 41, 71 comprise only two bumps with a single device cell 43, 73 therebetween, when arranged in staggered adjacent parallel lines as described above, the result is equivalent to that obtained using the four-bump clusters 46, 76. This can be seen by examining the relative position of clusters 411, 412 and 711, 712 in FIGS. 3 and 6 respectively. As with clusters 46, 76, clusters 41, 71 can overlap so that the symmetrical device array of FIG. 3 or the asymmetrical device array of FIG. 6 can be formed using arrays of clusters 41, 71. In the embodiments illustrated in FIGS. 3 and 6, clusters 411, 412 and 711, 712 are staggered by approximately one third of the cluster length, but this is not essential.

According to a first embodiment, there is provided a flip-chip electronic device, comprising, multiple device cells having one or more active elements therein, multiple bumps adapted to thermally couple the device cells to an external substrate, and wherein the bumps and device cells are arranged so that four bumps substantially form a compact cluster around each device cell and the device comprises an X-Y array of such clusters. In a further embodiment, sharing of bumps or device cells between some adjacent clusters is allowed. In a still further embodiment, the bumps are spaced apart at least by the minimum allowed bump pitch. In a yet further embodiment, an outer perimeter of the device is formed by bumps spaced-apart by a minimum allowed bump pitch. In a still yet further embodiment, the cluster has diagonals and a principal direction of the cells is aligned with one of the diagonals. In a yet still further embodiment, the bumps and device cells are arranged in clusters wherein the four bumps substantially form a cross with the four bumps at ends of arms of the cross and with the device cell at the intersection of the arms of the cross and wherein a principal direction of the device cell is aligned with one of the anus of the cross. In another embodiment, the clusters are substantially square.

According to a second embodiment, an electronic device is provided, comprising, an array of device cells, and an array of bumps disposed so that four bumps surround each device cell in substantially equal thermal communication with the surrounded device cell. In a further embodiment, the four bumps are arranged so that lines drawn between pairs of bumps form arms of a cross and the device cell is located at the intersection of the arms of the cross. In a still further embodiment, the device cells comprise multiple active elements. In a yet further embodiment, at least some of the device cells comprise at least two active elements and at least two ballast resistors, whose long dimensions are aligned parallel to a first arm of the cross. In a still yet further embodiment, the at least two active elements are located closer to bumps on the second arm of the cross than the ballast resistors.

According to a third embodiment, there is provided an electronic device, comprising, multiple device cells, each device cell having an axis, multiple bumps disposed so that each device cell has first and second bumps thermally disposed on opposite sides of the device cell substantially on the axis thereof, thereby forming a cluster, and wherein at least a portion of the device comprises a parallel array of adjacent clusters, staggered so that a bump of one cluster is disposed next to a device cell of an adjacent cluster. In a further embodiment, the bumps of each cluster are separated by at least the minimum allowed bump spacing. In a still further embodiment, the clusters are arranged so that bumps form an exterior perimeter of the device. In a yet further embodiment, the clusters are arranged so that the bumps form an exterior boundary of the device on at least two sides thereof. In a still yet further embodiment, the parallel array of such clusters with a bump of one cluster disposed next to a device cell of an adjacent cluster has bumps of adjacent clusters substantially equally spaced. In a yet still further embodiment, clusters are serially arranged along a common axis to form lines of clusters arranged adjacent to each other but longitudinally displaced by approximately one-third the length of the cluster. In another embodiment, a perimeter of the device is formed by bumps on at least two sides thereof. In yet another embodiment, at least some of the multiple device cells comprise two active regions and two ballast resistors, wherein the two active regions are located closer to the bumps of the cluster than the ballast resistors.

While at least one exemplary embodiment has been presented in the foregoing detailed description, it should be appreciated that a vast number of variations exist, especially with respect to choices of device types and materials, the number of active device fingers or other dissipating elements in each device cell and so forth. The above-described invention is especially useful for formation of semiconductor devices such as power amplifiers, but persons of skill in the art will understand based on the description here in that other types of devices can also be fabricated using the principles described herein, and that the invention is not limited merely to the examples presented for purposes of explanation. For example, and not intended to be limiting, the present invention is useful for fabrication of integrated passive devices, electro-optic devices, small signal devices, digital and analog devices, and combinations thereof on semiconductor and other substrates. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A flip-chip electronic device, comprising:
   a first cluster comprising
      a first device cell having one or more active elements, and
      multiple first cluster bumps directly adjacent to and in close thermal proximity to the first device cell and adapted to thermally couple the first device cell to an external substrate,
      wherein the multiple first cluster bumps include at least a first bump, a second bump, a third bump, and a fourth bump, and wherein the first device cell is centered between and equidistant from the first bump, the second bump, the third bump, and the fourth bump, wherein the first bump is directly adjacent a first side of the first device cell, the second bump is directly adjacent a second side of the first device cell, the third bump is directly adjacent a third side of the first device cell, and the fourth bump is directly adjacent a fourth side of the first device cell; and
   a second cluster comprising
      a second device cell having one or more active elements, and
      multiple second cluster bumps directly adjacent to and in close thermal proximity to the second device cell and adapted to thermally couple the second device cell to the external substrate, wherein the multiple second cluster bumps include at least the fourth bump, a fifth bump, a sixth bump, and a seventh bump, wherein the fourth bump is directly adjacent a first side of the second device cell, the fifth bump is directly adjacent a second side of the second device cell, the sixth bump is directly adjacent a third side of the second device cell, and the seventh bump is directly adjacent a fourth side of the second device cell.

2. The device of claim 1, wherein the bumps are spaced apart at least by a minimum allowed bump pitch.

3. The device of claim 1, wherein an outer perimeter of the device includes bumps spaced-apart by a minimum allowed bump pitch.

4. The device of claim 1, wherein for the first cluster, device fingers of the first device cell are aligned along a first axis, and wherein two of the multiple first cluster bumps are aligned on either side of the first device cell along the first axis, and wherein another two of the multiple first cluster bumps are aligned on either side of the first device cell along a second axis, which is perpendicular to the first axis.

5. The device of claim 1, wherein the first bump, the second bump, the third bump, and the fourth bump are positioned along arms of a cross, wherein the first device cell is positioned at an intersection of the arms of the cross, and wherein a principal direction of the first device cell is aligned with one of the arms of the cross.

6. The device of claim 1, wherein the clusters are substantially square.

7. The flip-chip electronic device of claim 1, further comprising:
a third cluster comprising
a third device cell having one or more active elements, and
multiple third cluster bumps directly adjacent to and in close thermal proximity to the third device cell and adapted to thermally couple the third device cell to the external substrate,
wherein the at least one bump of the multiple first cluster bumps is included in the multiple third cluster bumps, and
wherein the first device cell, the second device cell, and the at least one bump of the multiple first cluster bumps are aligned along a first axis, and
wherein the third device cell and the at least one bump of the multiple first cluster bumps are aligned along a second axis that is perpendicular to the first axis.

8. The flip-chip electronic device of claim 1, wherein the multiple first cluster bumps include only the first bump, the second bump, the third bump, and the fourth bump, and wherein the multiple second cluster bumps include only the fourth bump, the fifth bump, the sixth bump, and the seventh bump.

9. The flip-chip electronic device of claim 1, wherein the first bump is centered along the first side of the first device cell, the second bump is centered along the second side of the first device cell, the third bump is centered along the third side of the first device cell, and the fourth bump is centered along the fourth side of the first device cell.

10. An electronic device, comprising:
a plurality of clusters arranged in an array, wherein each cluster of the array includes a device cell; and
multiple bumps disposed around the device cell so that four bumps surround the device cell, wherein the four bumps are positioned directly adjacent to four sides of the device cell so that the device cell is centered between and equidistant from the four bumps, and wherein the four bumps are in substantially equal thermal communication with the first device cell, and wherein at least one bump of a first cluster of the plurality of clusters is included in the multiple bumps of a second cluster of the plurality of clusters that is adjacent to the first cluster, and wherein the at least one bump of the first cluster is directly adjacent to a side of a device cell of the second cluster.

11. The device of claim 10, wherein the four bumps are arranged so that lines drawn between pairs of bumps form arms of a cross and the device cell is located at the intersection of the arms of the cross.

12. The device of claim 10, wherein the device cell comprises multiple active elements.

13. The device of claim 10, wherein the four bumps are arranged so that lines drawn between pairs of bumps form arms of a cross and the device cell is located at the intersection of the arms of the cross, and wherein
the device cell comprises at least two active elements and at least two ballast resistors, wherein long dimensions of the at least two active elements and the at least two ballast resistors are aligned parallel to a first arm of the cross.

14. The device of claim 13, wherein the at least two ballast resistors are located between the at least two active elements.

15. The flip-chip electronic device of claim 10, wherein the multiple bumps include only the four bumps.

16. The flip-chip electronic device of claim 10, wherein each of the four bumps is centered along a different side of the device cell.

17. An electronic device, comprising:
multiple first device cells, wherein a center of each device cell of the multiple first device cells is aligned along a first axis;
multiple first-axis aligned bumps disposed directly adjacent to and in thermal proximity to the multiple first device cells and aligned substantially along the first axis, wherein a first device cell of the multiple first device cells and the first-axis aligned bumps that are directly adjacent to the first device cell form a first cluster, and wherein a first-axis aligned bump is disposed between each pair of adjacent first device cells and the first-axis aligned bump is directly adjacent to sides of both of the adjacent first device cells; and
multiple second device cells, wherein a center of each device cell of the multiple second device cells is aligned along a second axis that is parallel with and offset from the first axis; and
multiple second-axis aligned bumps disposed directly adjacent to and in thermal proximity to the multiple second device cells and aligned substantially along the second axis, wherein a second device cell of the multiple second device cells and the second-axis aligned bumps that are directly adjacent to the second device cell form a second cluster, and wherein a second-axis aligned bump is disposed between each pair of adjacent second device cells and the second-axis aligned bump is directly adjacent to sides of both of the adjacent second device cells, and wherein a first-axis aligned bump of the first cluster is disposed directly adjacent to the second device cell of the second cluster, and a second-axis aligned bump of the second cluster is disposed directly adjacent to the first device cell of the first cluster.

18. The device of claim 17, wherein the bumps of each cluster are separated by at least the minimum allowed bump spacing.

19. The device of claim 17, wherein the clusters are arranged so that bumps form an exterior perimeter of the device.

20. The device of claim 17, wherein the clusters are arranged so that the bumps form an exterior boundary of the device on at least two sides of the device.

21. The device of claim 17, wherein the bumps of adjacent clusters are substantially equally spaced.

22. The device of claim 17, wherein the first cluster and the second cluster are staggered with respect to each other by approximately one-third of a cluster length.

23. The device of claim 22, wherein a perimeter of the device is formed by bumps on at least two sides of the device.

24. The device of claim 17, wherein at least some of the multiple first and second device cells each comprise two active regions and two ballast resistors, wherein the two active regions are located closer to the bumps of the cluster than the ballast resistors.

25. The flip-chip electronic device of claim 17, wherein a first-axis aligned bump of the first-axis aligned bumps and a center of a second device cell of the multiple second device cells are aligned along a third axis that is perpendicular to the first axis and the second axis.

* * * * *